(12) United States Patent
Tadepalli

(10) Patent No.: US 9,817,064 B1
(45) Date of Patent: Nov. 14, 2017

(54) I/O CONTROL CIRCUIT FOR REDUCED PIN COUNT (RPC) DEVICE TESTING

(71) Applicant: Texas Instruments Incorporated, Dallas, TX (US)

(72) Inventor: Ramana Tadepalli, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1 day.

(21) Appl. No.: 15/135,184

(22) Filed: Apr. 21, 2016

(51) Int. Cl.
*G01R 31/10* (2006.01)
*G01R 31/28* (2006.01)
*G01R 31/26* (2014.01)

(52) U.S. Cl.
CPC ......... *G01R 31/2874* (2013.01); *G01R 31/26* (2013.01); *G01R 31/2834* (2013.01)

(58) Field of Classification Search
CPC G01R 31/26; G01R 31/2642; G01R 31/2648; G01R 31/2831; G01R 31/31702; G01R 31/2856; G01R 31/2875; G01R 31/2877; G01R 31/2874
See application file for complete search history.

(56) References Cited

U.S. PATENT DOCUMENTS

| 6,536,006 B1* | 3/2003 | Sugamori | G01R 31/3167 714/724 |
| 6,678,852 B2* | 1/2004 | Tsuto | G01R 31/31935 714/733 |
| 6,856,158 B2* | 2/2005 | Frame | G06F 11/273 324/762.01 |
| 7,243,278 B2 | 7/2007 | Arkin | |

* cited by examiner

*Primary Examiner* — Tung X Nguyen
(74) *Attorney, Agent, or Firm* — Kenneth Liu; Charles A. Brill; Frank D. Cimino

(57) ABSTRACT

An I/O control circuit includes a plurality of IO cells including an input section for stimulating a plurality of (n) pins of a device under test (DUT) and an output section for processing data output by the pins. The input section of each cell includes a latched driver each including a driver input, a first driver output, a next state driver output, and a current source. The next state driver output and current source are for coupling to drive the pins, and the latched drivers are serially connected with the first driver output of an earlier IO cell connected to the driver input of a next IO cell. The output section of each cell includes an analog to digital converter (ADC) for coupling to the n pins, and a memory element coupled to an output of the ADC.

14 Claims, 6 Drawing Sheets

US 9,817,064 B1

I/O CONTROL CIRCUIT FOR REDUCED PIN COUNT (RPC) DEVICE TESTING

FIELD

Disclosed embodiments relate to electrical testing of semiconductor integrated circuit (IC) devices.

BACKGROUND

A full pin count (FPC) test is where a tester connects to all device pins of a semiconductor device which is generally used for probing or testing most semiconductor devices. However, for some digital system-on-a-chip (SOC) devices, such as advanced processors, that have a large gate counts (and thus large device pin counts such as 600 to 760 pins) for cost reasons a reduced pin count (RPC) test, where the tester only physically contacts a subset (e.g., 10%) of the device pins during the test, is generally used with the remaining device pins being untested.

Some devices for certain application however require stress conditions (higher than normal operating |voltage| and/or temperature) during probe or test. RPC does not allow imposing an electrical stress on the untested pins. For such devices (e.g., SOC processors) needing electrical stress during test, there is thus a significant challenge moving to in-situ burn-in because the FPC test needed to stress all pins results in a low test throughput. Another option is split testing (the combination of RPC and FPC) which can be implemented to improve multisite efficiency and throughput (ultimately the cost of test) as compared to 100% FPC, but this testing combination does not electrically stress all the device pins.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include an input/output (I/O) control circuit having n IO cells including an input section for stimulating n pins of a device under test (DUT) and an output section that processes data output by these n pins. The DUT can be a digital or analog device. The input section of each of the cells includes a latched driver including a driver input, a first driver output, and a next state driver output, and a current source, where the next state driver output and current source are for coupling to drive the individual pins of the DUT. The latched drivers are serially connected together with the first driver output of an earlier one of the IO cells being connected to the driver input of the next IO cell. The output section of each of the cells include an analog to digital converter (ADC) for coupling to the individual (n) pins of the DUT, and a memory element that is coupled to an output of the ADC.

In operation a high speed test signal received from automatic test equipment (ATE) propagates through the IO cells through the latched drivers, and test data from the DUT is read out in parallel at a speed lower from each of the DUT pins from the memory element of each of the IO cells. Disclosed I/O control circuits thus provide a fan out effect, so that a relatively small number of ATE connections to pins of the DUT are able or test a significantly larger number (n) of DUT pins. ATE input connections received by the input section are fanned out to contact and test a significantly larger number (n) of DUT pins, and the output section also provides a smaller number outputs (<n) for receipt by the smaller number of ATE output connections. Disclosed IO control circuits thus can provide a bridge between reduced pin count (RPC) testing and full pin count (FPC) testing, allowing an RPC insertion to function as FPC testing by testing all DUT pins.

BRIEF DESCRIPTION OF THE DRAWINGS

Reference will now be made to the accompanying drawings, which are not necessarily drawn to scale, wherein.

DETAILED DESCRIPTION

Figure 1A:
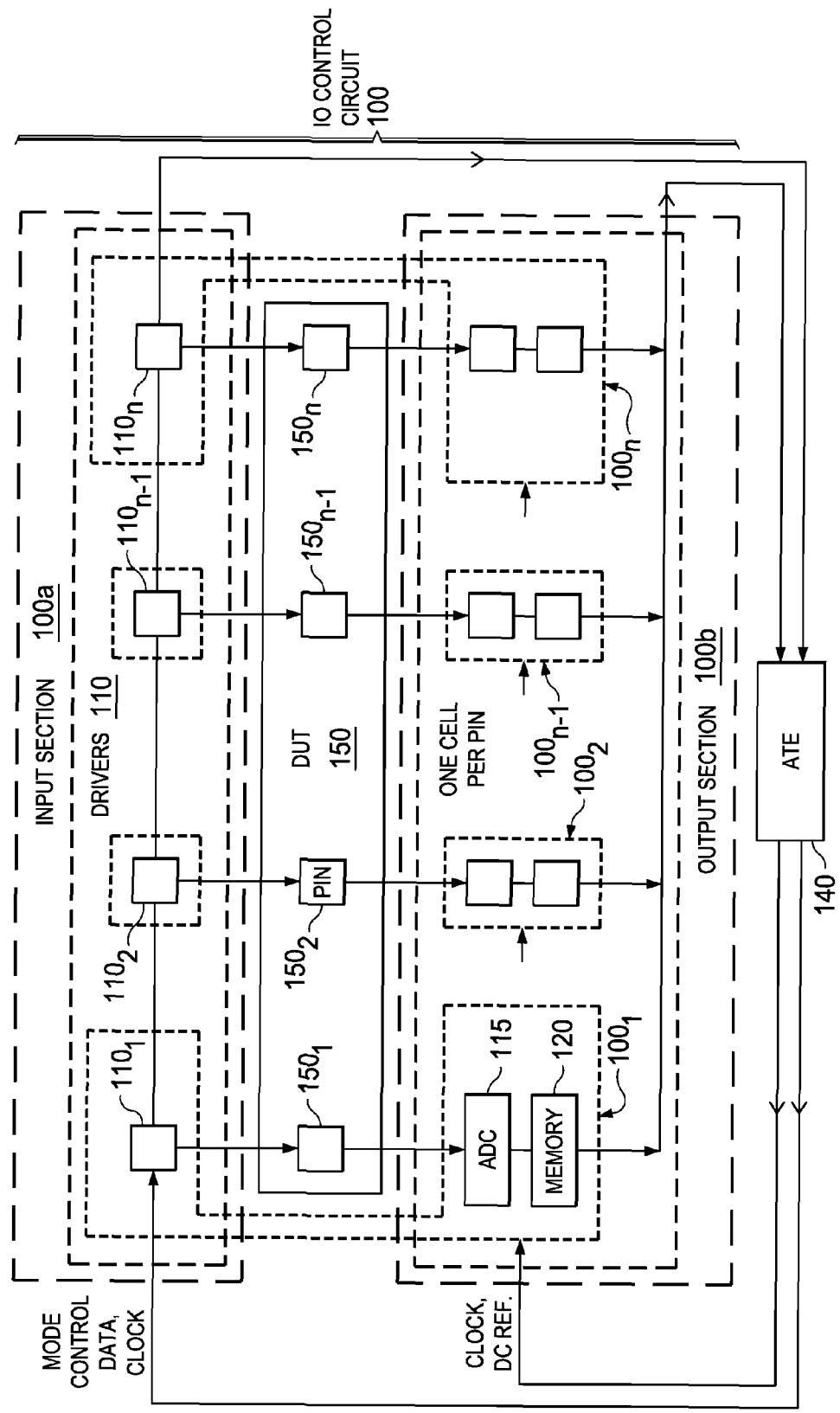
FIG. 1A shows an example I/O control circuit including a plurality of serially connected IO cells each including a latched driver, wherein a high speed test signal received from an ATE propagates through the IO cells through the latched drivers, and test data from the DUT is read out in parallel at a speed lower from each of the DUT pins from the memory element of each of the IO cells.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A shows an example I/O control circuit 100 including a plurality of serially connected. IO cells $100_1$, $100_2$, $100n\text{-}1$ and $100n$. There is one IO cell shown for each of the n pins $150_1$, $150_2$, $150n\text{-}1$ and $150n$ of the DUT 150. The IO cells include an input section 100a for stimulating n pins of the DUT 150 and an output section 100b that processes data output by these n DUT pins. The DUT 150 can be a digital or an analog device.

The input section of each of the cells include a latched driver $110_1$, $110_2$, $110n-1$ and $110n$ (drivers collectively shown in FIGS. 1A and 1B as 110) including a driver input, a first driver output, and a next state driver output, and a current source (see current source 111 in FIG. 2), where the next state driver output and current source are for coupling to drive the individual n pins of the DUT 150. A "current source" as used herein can be a current source, a current sink, or a bidirectional current source. The latched drivers are serially connected together with the first driver output of an earlier one of the IO cells being connected to the driver input of the next IO cell. The output section 100b of each of the cells include an analog to digital converter (ADC 115) for coupling to the individual pins of the DUT, and a memory element 120 that is coupled to an output of the ADC.

In operation of the IO control circuit 100 a high speed test signal (shown in FIGS. 1A and 1B as "data") received from the ATE 140 propagates through the IO cells $100_1$ to $100_n$ through the latched drivers $110_1$ to $110_n$ and test data from the DUT 150 is read out in parallel at a speed lower than the high speed test signal from each of the n DUT pins $150_1$ to $150_n$ from the memory element 120 of each of the IO cells $100_1$ to $100_n$. The data output typically contains test information such as continuity, contact resistance, and/or functional operation of the pins coupled into the I/O control circuit 100 including those DUT pins not directly contacted by the ATE 140. As known in the art, latched drivers include an output enable (OE). It is noted that n can generally be any number, only limited by the serial signal speed to parallel signal speed ratio through their respective IO control circuit signal paths. The high speed test is typically performed at ≥100 MHz, such as around 1 GHz. Electrical stress is optional.

Figure 1B:
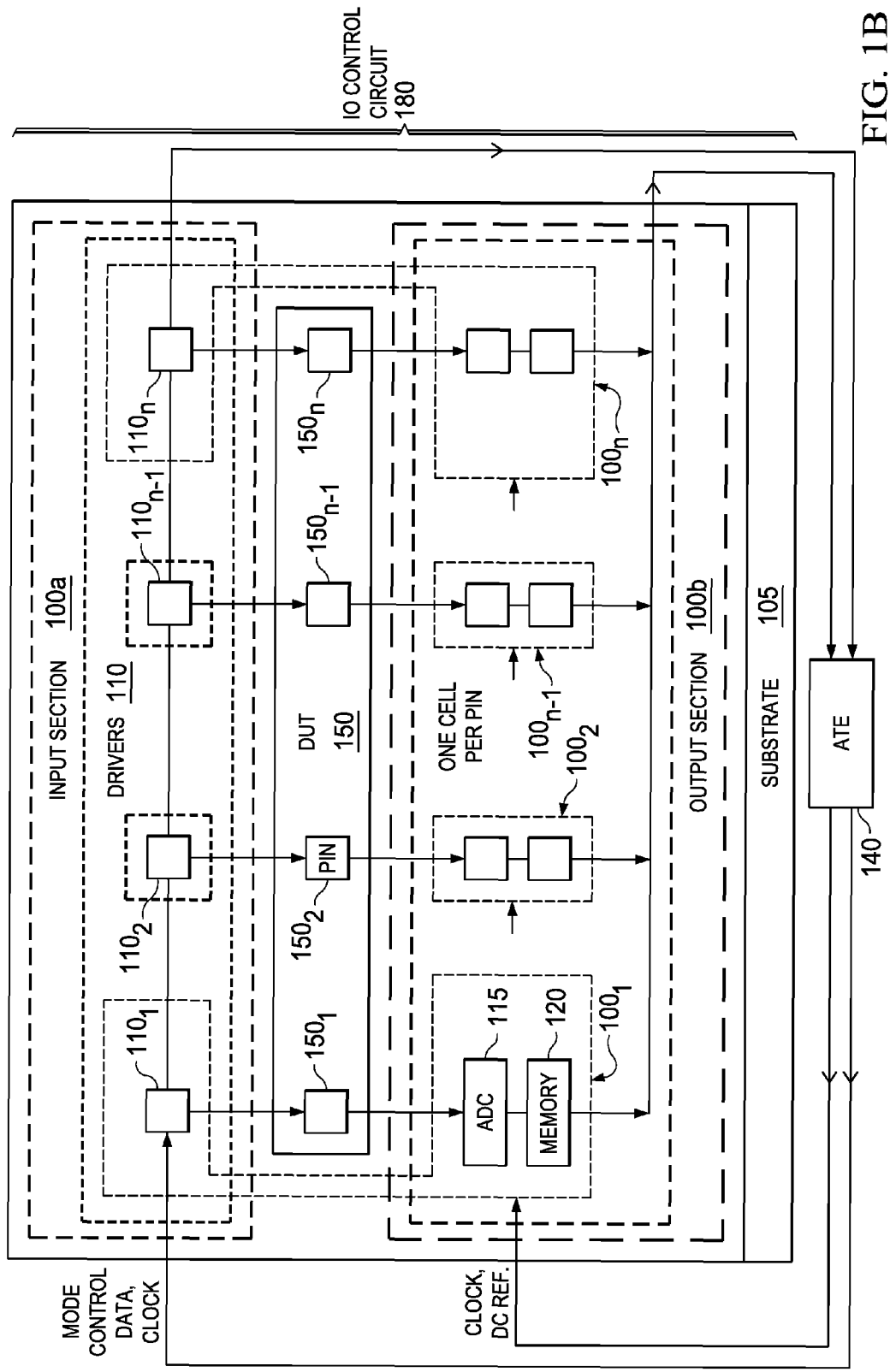
FIG. 1B shows an example I/O control circuit formed a common die with the DUT.
Figure 2:
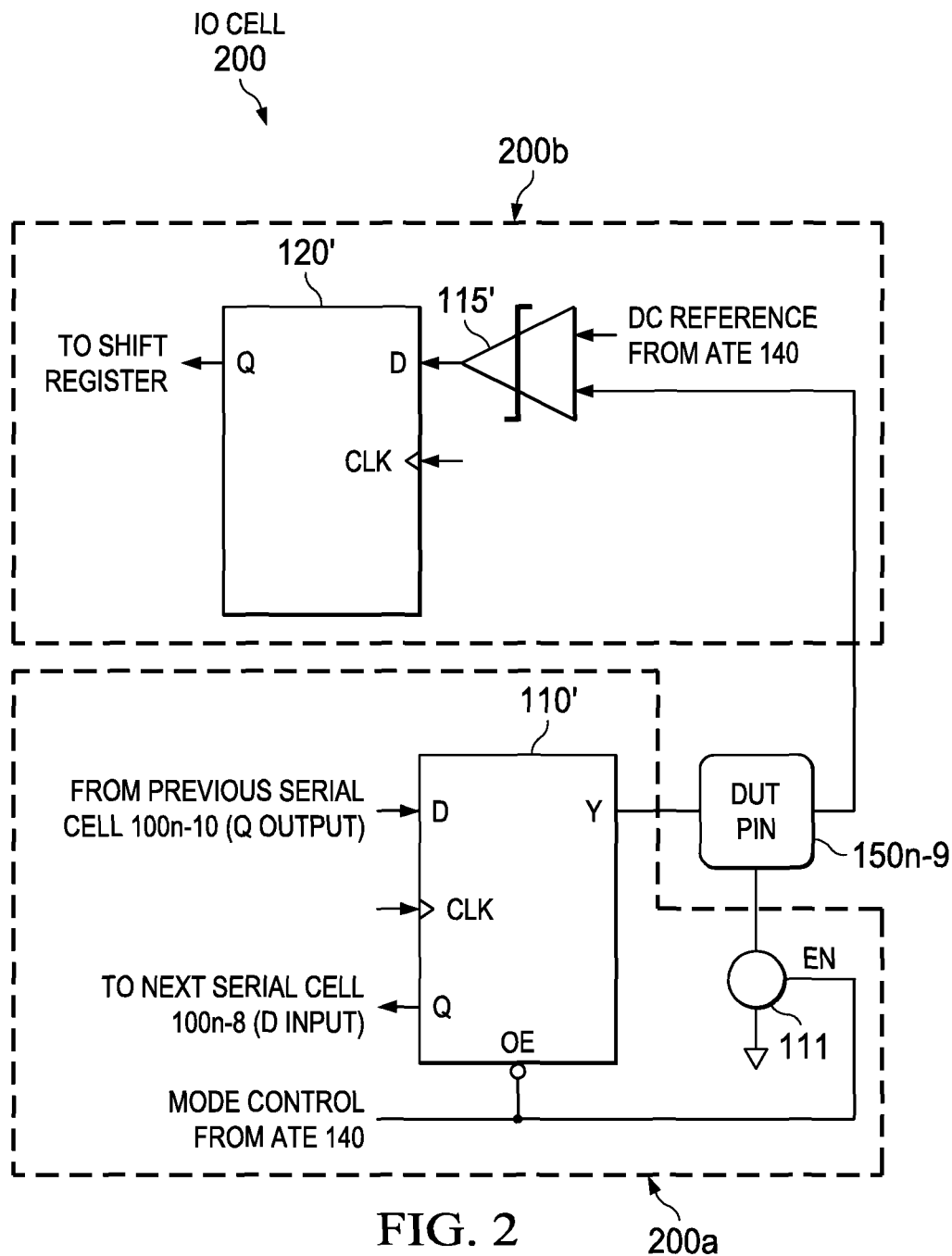
FIG. 2 shows an example IO cell according to an example embodiment with the latched driver being shown as a latched D flip flop, the ADC being shown as a comparator, and the memory element being shown as a D flip flop.

IO control circuit 100 provides a fan out effect. Five (5) inputs are shown provided to the I/O control circuit 100 including mode control, data and a clock all coupled to the latched driver $110_1$, and the clock and a DC reference coupled to the output section 100b. As shown in FIG. 2 described below the output section 200b of the ADC shown as a comparator 115' receives the DC reference from the ATE 140 and the clock is coupled to the memory element 120'. The DUT's power supply connections are typically amongst the DUT pins that are directly coupled from the ATE 140, and are also present in RPC. Accordingly, only five (5) ATE connections (plus power supply connections) received at inputs of the IO control circuit 100 are fanned out to test a significantly larger number (n) DUT pins, and only two (2) ATE connections receive outputs from the IO control circuit 100, with one from latched driver 110n and one from the signal line coupling the memory elements 120 of the respective cells together as shown in FIGS. 1A and 1B. This is a significant advantage when the number of pins on the device is large (e.g., several hundred) and the above count of DUT pins being contacted is unchanged regardless of the pin count of the DUT.

The latched drivers 110 can comprise flip flops, such as the latched D flip flop shown in FIG. 2. As known in the art, the D flip-flop tracks the input signal applied to its data (D) input, making transitions that match to those of the input D. The D flip-flop stores the value that is on the data line. As known in the art a D flip-flop can also be made from a set/reset (SR) flip-flop by tying the set (S) to the reset (R) through an inverter. A D flip flop characteristic table is shown below:

| D | Q | $Q^+$ or Y | Operation |
|---|---|---|---|
| 0 | 0 | 0 | Reset |
| 0 | 1 | 0 | Reset |
| 1 | 0 | 1 | Set |
| 1 | 1 | 1 | Set |

The D flip flop characteristic table has 3 columns, where the first column is the value of D, being the control (data) input. The second column is the current state, which is the current value being output by Q. The third column is the next state, that is, the value of Q at the next positive (clock) edge, labeled Q+ or Y.

Alternatives to flip flops for the latched driver 110 generally include shift registers. The next state driver output Y is shown coupled to force a pin of the DUT 150 to a high (H) or low (L) state. However, analog testing is also possible by variation of the supply for the individual drivers, using a 2 or more bit ADC, and additional memory for the memory element 120. For example, contact resistance information can be obtained by 'exercising' the DUT with the same data and 2 different voltage levels, and then comparing the resultant data converted using a multi-bit ADC.

The ADC 115 can be embodied as a comparator as shown in FIG. 2 which is essentially a 1 bit ADC. As noted above, ADC 115 can be a 2 or more bit ADC. Advantages of using a 2 or more bit ADC's include the ability to perform parametric (analog) tests, such as the measurement of contact resistance as described above.

The memory elements 120 store the outputs of the ADC's 115. The memory elements 120 can comprise flip flops, such as the D flip flop 120' shown in FIG. 2 described below. No output enable is needed for D flip flops when used for the memory elements 120. Alternatives to flip flops for the memory element 120 generally include any memory element, for the above-described analog option generally providing more memory per cell.

The I/O control circuit 100 is configured for testing at least a portion of the n pins of the DUT 150 by coupling a high speed test signal shown as "data" received from the ATE 140 to a driver input of a first IO cell ($100_1$) while applying a clock signal (as well applying a mode control, clock and a DC reference signal). The high speed test signal propagates through the IO cells $100_1$, $100_2$, $100n-1$ and $100n$ by propagating through the drivers $110_1$, $110_2$, $110n-1$ and $110n$ and is finally output from IO cell $100n$ (last IO cell in the chain of cells). Test data from each of the n pins of the DUT 150 is read out in parallel at low speed from the memory elements 120 that is lower compared to the higher speed of the high speed test signal as the output from the memory elements 120 are Time Division Multiplexed.

Disclosed IO control circuits can provide a bridge between RPC and FPC, such as for burn-in (BI), allowing an RPC insertion to actually control all IO pins for probe or package BI. Moreover, the problem of limited throughput at probe for large pin count devices (such as digital devices having several hundred pins) because of limited tester resources is thus solved by implementing an IO control circuit that allows channels used on some slow speed IQs to be redirected to increase the site count.

FIG. 1B shows an example I/O control circuit 180 formed on a common die with the DUT. The common die can be a die of a system-on-chip (SOC) die stack. The substrate 105 for the common die can comprise silicon, silicon-germanium, or other semiconductor material.

FIG. 2 shows an example IO cell 200 according to an example embodiment with the driver in the input section shown as 200*a* being shown as a D flip flop 110' along with a current source 111, the ADC in the output section shown as 200*b* being shown as a comparator 115', and the memory element also being shown as a D flip flop 120'. An OE pin for the D flip flop 110' is shown receiving a mode control signal that also provides an enable input for the current source 111. The IO cell 200 is shown being the IO cell for the n-9th pin of the DUT. The Q output of the previous serial IO cell 100*n*-10 is shown coupled to the D input, and the Q output is shown coupled to drive the D input of the next serial IO cell 100*n*-8.

Figure 3:
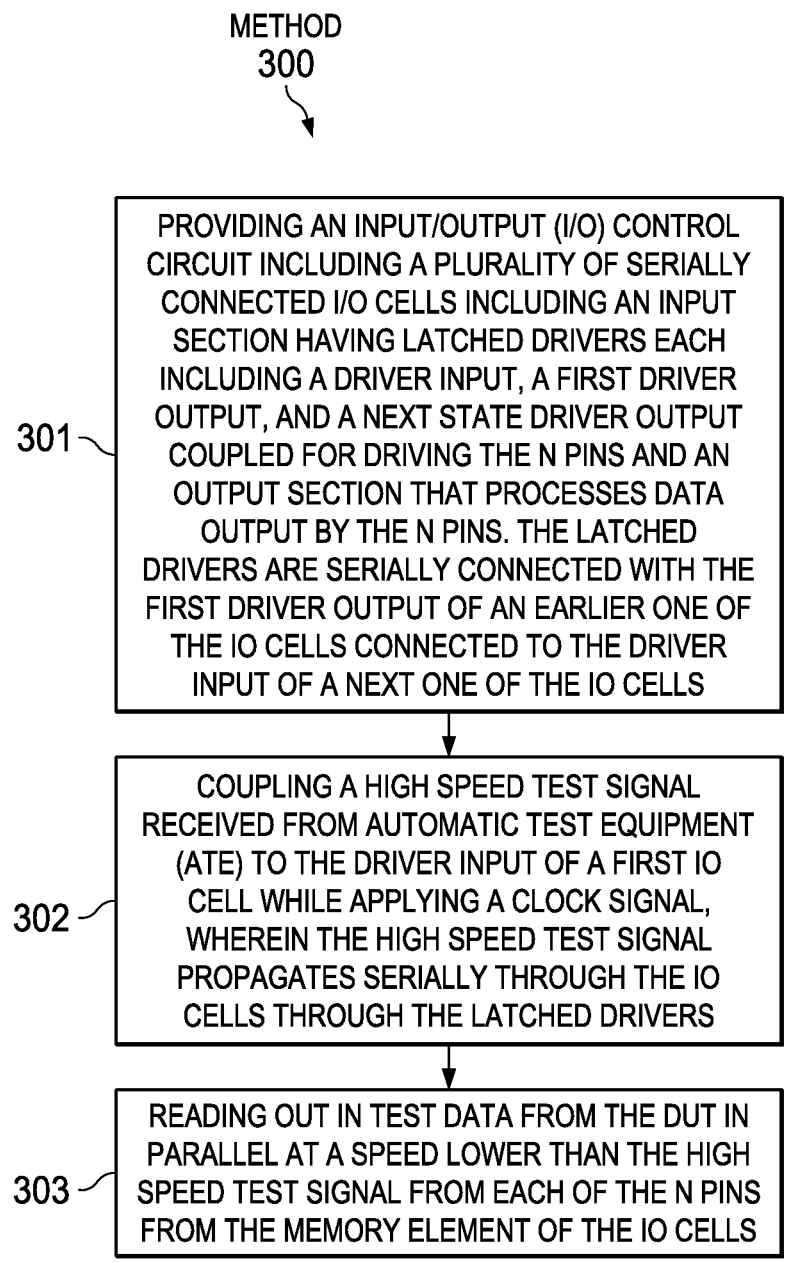
FIG. 3 is a flow chart showing steps in example method of testing a DUT having a plurality of pins using a disclosed I/O control circuit including a plurality of serially connected IO cells by coupling a high speed test signal received from an ATE to a latched driver input of a first IO cell while applying a clock signal, where the high speed test signal propagates through the IO cells through the latched drivers, and test data from the DUT is read out in parallel at a speed lower from each of the DUT pins from the memory elements of the IO cells.

FIG. 3 is a flow chart showing steps in example method 300 of testing a DUT having a plurality of pins by coupling a high speed test signal received from an ATE, where the high speed test signal propagates through the IO cells through the latched drivers, and test data from the DUT is read out in parallel at a speed lower than the high speed test signal from each of the DUT pins from the memory element of each of the IO cells. The ATE may provide forcing conditions in patterns. Step 301 comprises providing an I/O control circuit including a plurality of serially connected IO cells including an input section having latched drivers each including a driver input, a first driver output, and a next state driver output coupled for driving the n pins of the DUT and an output section that processes data output by the n pins. The latched drivers are serially connected with the first driver output of an earlier one of the IO cells connected to the driver input of a next one of the IO cells.

At least a portion of the n pins are then tested. The DUT can be in wafer form or in package form including as a SOC. The testing can comprise a burn-in operation performed in a burn-in oven. Step 302 comprises coupling a high speed test signal received from an ATE to the driver input of a first IO cell while applying a clock signal, wherein the high speed test signal propagates serially through the IO cells through the latched drivers. Step 303 comprises reading out in test data from the DUT in parallel at a speed lower than the high speed test signal from each of the n pins from the memory elements of the IO cells. The test data can be read into a shift register if the test is a digital test. Control/input pins will run at high speed as they are from the ATE 140 input. For a single 16 cell wide I/O control circuit, digital testing the single input chain will serially output 16 bits of 'drive' data.

Advantages of disclosed IO control circuits include enabling full controllability of the DUT at probe (and package test), reducing close to the RPC tester channel count while increasing site count. The cost of test is reduced which enables probe BI for large digital SOCs. Disclosed IO control circuits also ensure IC robustness because as a probe solution they improve final test yield because all die continuity failures can be identified and thus retained at wafer probe.

EXAMPLES

Disclosed embodiments are further illustrated by the following specific Examples, which should not be construed as limiting the scope or content of this Disclosure in any way.

Figure 4A:
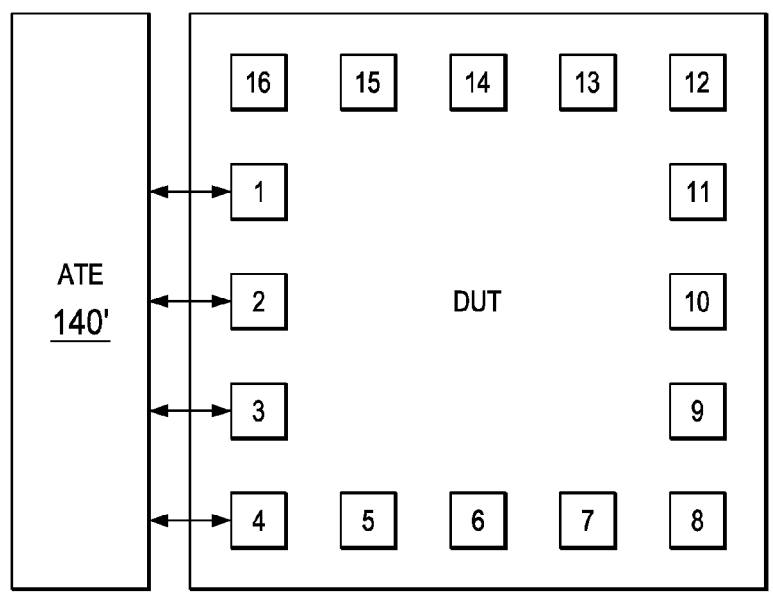
FIGS. 4A-4C depicts a 16 pin DUT being tested by a 16 pin ATE using conventional RPC, conventional FPC, and a disclosed IO control circuit that enables FPC, respectively.
Figure 4B:
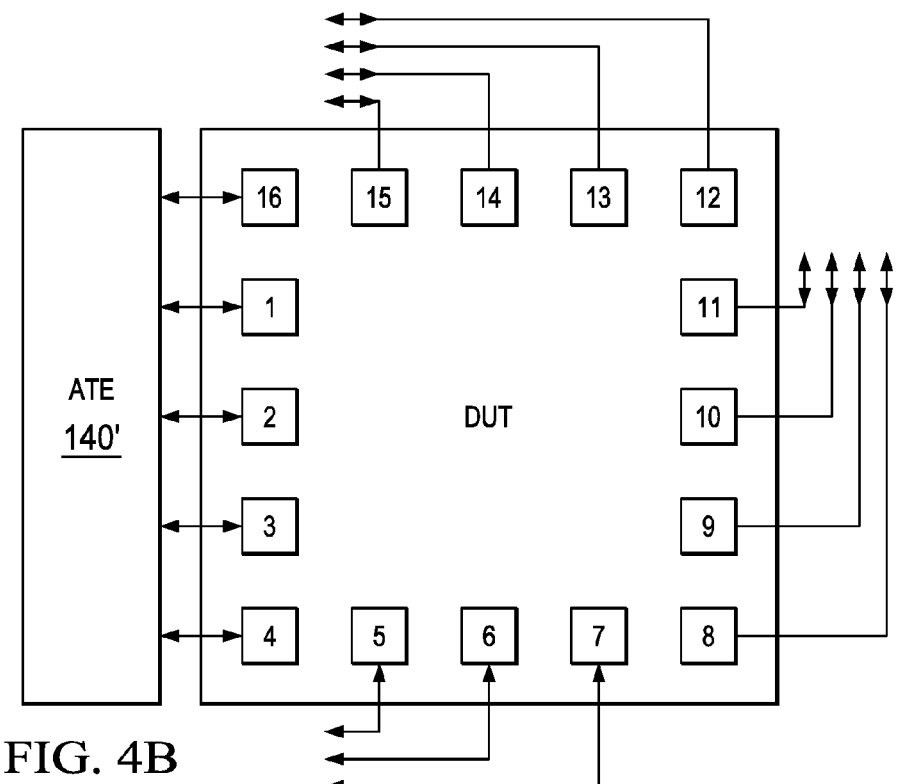
Figure 4C:
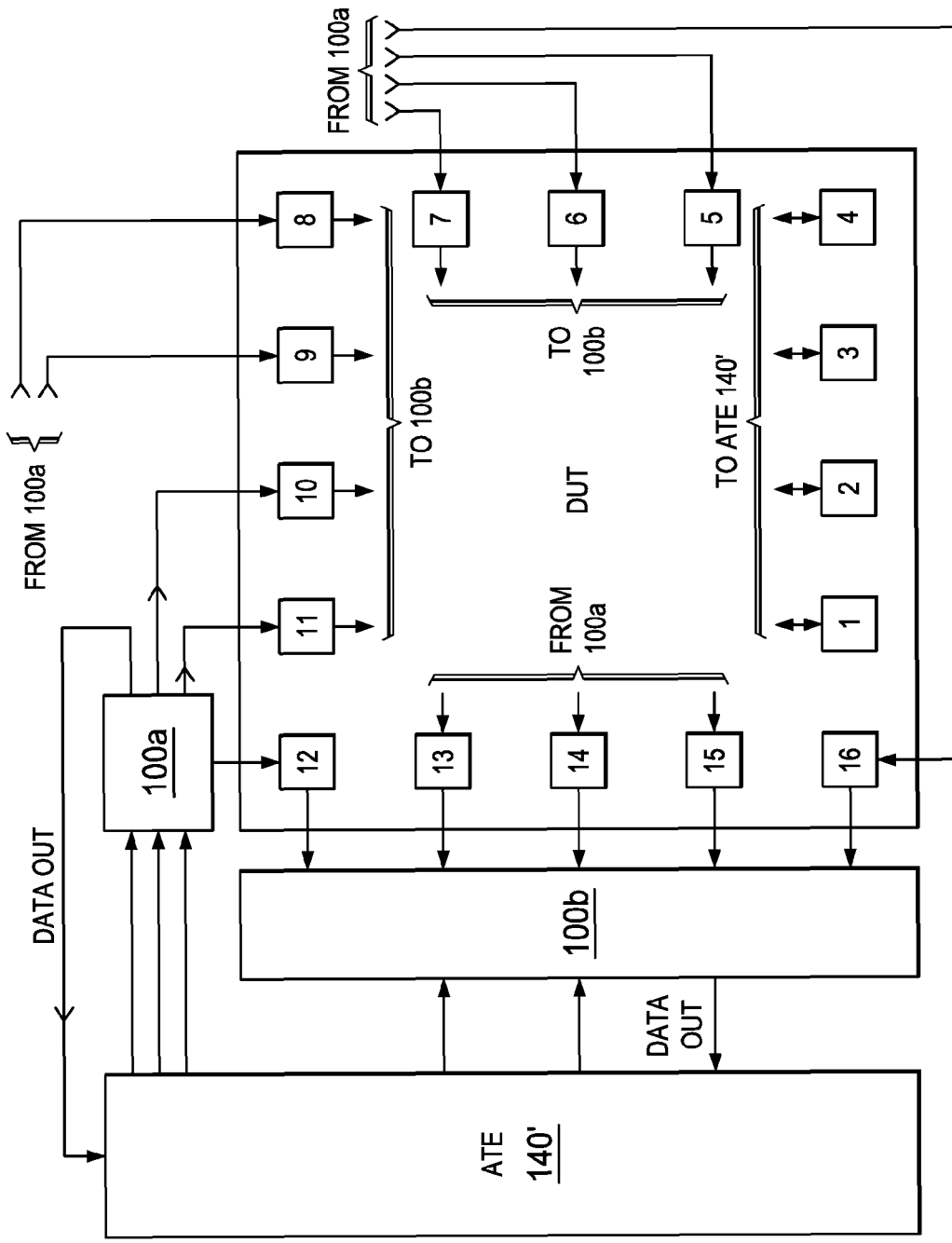

FIGS. 4A-4C depicts a 16 pin DUT being tested by a 16 pin ATE 140' using conventional RPC, conventional FPC, and a disclosed IO control circuit enabled FPC, respectively.

In FIG. 4A the ATE 140' contacts and tests 4 of the 16 DUT pins so that 12 pins are unconnected and thus are untested pins, meaning one can simultaneously RPC test 4 of these DUTs at a time. In FIG. 4B the ATE 140' tests all 16 DUT pins (FPC testing), so that all DUT pins are connected and thus are all tested pins, meaning one can FPC test only 1 of these DUTs at a time.

In FIG. 4C, 4 pins of the ATE 140' being mode control, data and clock to input section 100*a*, and a DC ref to output section 100*b* along with the clock are shared by all 16 DUT pins (power supply pins are not counted in ATE pins as they are global from the ATE but not included in the pin count), which is enabled by a disclosed IO control circuit which includes an input section 100*a* and output section 100*b* that provides the above-described fan out effect to enable FPC. Accordingly, despite the ATE 140' contacting only 4 DUT pins in FIG. 4C in this example during RPC, all 16 DUT pins are tested so that besides the 4 contacted DUT pins all 12 non-ATE contacted pins are still tested by the ATE 140' so that FPC is provided. It is noted the exact DUT pin count does not change disclosed testing because there is a need to only contact a handful of DUT pins (e.g., 4 pins) which does not change when the 16 pin DUT described in this Example scales to say 760 pins in one particular example.

Disclosed embodiments can be used to probe or package test a variety of different IC devices and related products. The IC die(s) may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die(s) can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of testing a semiconductor device under test (DUT) having a plurality of (n) pins, comprising:
   providing an input/output (I/O) control circuit including a plurality of serially connected IO cells including an input section having latched drivers each including a driver input, a first driver output, and a next state driver output coupled to drive said n pins, and an output section including an analog to digital converter (ADC) coupling to said n pins that processes data output by said n pins, and a memory element coupled to an output of said ADC, wherein said latched drivers are serially connected with said first driver output of an earlier one of said plurality of IO cells connected to said driver input of a next one of said plurality of IO cells,
   coupling a high speed test signal received from automatic test equipment (ATE) to said driver input of a first of said plurality of IO cells while applying a clock signal, wherein said high speed test signal propagates serially through said plurality of said IO cells through said latched drivers, and
   reading out test data from said DUT in parallel at a speed lower than said high speed test signal from each of said n pins from said memory element of each of said plurality of IO cells.

2. The method of claim 1, wherein said input section includes a current source coupled to drive said n pins.

3. The method of claim 1, wherein said testing is performed under at least electrical stress conditions.

4. The method of claim 1, wherein said latched drivers comprise D Flip Flops.

5. The method of claim 1, wherein said I/O control circuit is formed on a common substrate with said DUT.

6. The method of claim 1, wherein said DUT comprises a digital system-on-a-chip (SOC).

7. The method of claim 1, wherein said DUT is on a wafer having a plurality of said DUTs, and wherein said testing comprises wafer probing.

8. The method of claim 1, wherein said DUT is a singulated DUT, and wherein said testing comprises package testing.

9. The method of claim 1, wherein said DUT is in package form, and wherein said testing comprises a burn-in operation performed in a burn-in oven.

10. An input/output (I/O) control circuit, comprising:
a plurality of IO cells, including an input section for stimulating a plurality of (n) pins of a device under test (DUT) and an output section for processing data output by said n pins,
wherein said input section of each of said plurality of IO cells includes a latched driver including a driver input, a first driver output, a next state driver output, and a current source, wherein said next state driver output and said current source are coupled to drive said n pins, and wherein said latched drivers are serially connected with said first driver output of an earlier one of said plurality of IO cells connected to said driver input of a next one of said plurality of IO cells, and
wherein said output section of each of said plurality of IO cells includes an analog to digital converter (ADC) coupled to said n pins, and a memory element coupled to an output of said ADC.

11. The I/O control circuit of claim 10, wherein said latched drivers comprise latched D Flip Flops.

12. The I/O control circuit of claim 11, wherein said memory elements comprise D Flip Flops.

13. The I/O control circuit of claim 10, wherein said I/O control circuit is formed on a common substrate with said DUT.

14. The I/O control circuit of claim 10, wherein said ADC's comprise comparators.

* * * * *